United States Patent
Freitag et al.

(10) Patent No.: US 7,848,065 B2
(45) Date of Patent: Dec. 7, 2010

(54) MAGNETORESISTIVE SENSOR HAVING AN ANISOTROPIC HARD BIAS WITH HIGH COERCIVITY

(75) Inventors: James Mac Freitag, Sunnyvale, CA (US); Mustafa Michael Pinarbasi, Morgan Hill, CA (US); Wipul Pemsiri Jayasekara, Los Gatos, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 1019 days.

(21) Appl. No.: 11/615,825

(22) Filed: Dec. 22, 2006

(65) Prior Publication Data

US 2008/0151441 A1 Jun. 26, 2008

(51) Int. Cl.
*G11B 5/39* (2006.01)
(52) U.S. Cl. .................................. 360/324.12
(58) Field of Classification Search ............... 360/324.1, 360/324.11, 324.12, 324.2
See application file for complete search history.

(56) References Cited

U.S. PATENT DOCUMENTS

| | | | | |
|---|---|---|---|---|
| 6,144,534 A | 11/2000 | Xue et al. | ............... | 360/327.31 |
| 6,185,081 B1 | 2/2001 | Simion et al. | ............ | 360/327.3 |
| 6,261,468 B1 | 7/2001 | Sato et al. | ..................... | 216/22 |
| 6,315,875 B1 | 11/2001 | Sasaki | .................. | 204/192.34 |
| 6,353,318 B1 | 3/2002 | Sin et al. | ..................... | 324/252 |
| 6,577,477 B1 | 6/2003 | Lin | ........................ | 360/324.12 |
| 6,632,474 B1 | 10/2003 | Horng et al. | ................. | 427/131 |
| 6,636,400 B2 | 10/2003 | Pinarbasi et al. | ....... | 360/324.12 |
| 6,668,443 B2 | 12/2003 | Chien et al. | ............... | 29/603.18 |
| 6,813,121 B2 | 11/2004 | Pinarbasi | ..................... | 360/322 |
| 7,050,274 B2 * | 5/2006 | Seigler et al. | ........... | 360/324.11 |
| 7,189,583 B2 * | 3/2007 | Drewes | ........................ | 438/3 |
| 7,446,987 B2 * | 11/2008 | Zhang et al. | ............. | 360/324.12 |
| 2002/0051328 A1 | 5/2002 | Hasagawa | .................... | 360/322 |
| 2002/0126429 A1 | 9/2002 | Min et al. | .............. | 360/324.12 |
| 2004/0105192 A1 * | 6/2004 | Chien et al. | ............... | 360/324.1 |
| 2004/0196597 A1 | 10/2004 | Marinero | ................. | 360/324.12 |
| 2008/0137237 A1 * | 6/2008 | Freitag et al. | .......... | 360/324.12 |

* cited by examiner

*Primary Examiner*—Jefferson Evans
(74) *Attorney, Agent, or Firm*—Zilka-Kotab, PC

(57) ABSTRACT

A magnetoresistive sensor having magnetically anisotropic bias layers for biasing the free layer of the sensor. Hard bias structures for biasing the magnetization of the free layer are formed at either side of the sensor stack, and each of the hard bias structure includes a hard magnetic layer that has a magnetic anisotropy to enhance the stability of the biasing. The hard bias structure can include a Cr under-layer having a surface that has been treated by a low power angled ion milling to form it with an anisotropic surface texture. A layer of Cr—Mo alloy is formed over the Cr under-layer and the hard magnetic material layer is formed over the Cr—Mo alloy layer. The anisotropic surface texture of the Cr layer induces an aligned crystalline structure in the hard magnetic layer that causes the hard magnetic layer to have a magnetic anisotropy.

10 Claims, 17 Drawing Sheets

MAGNETORESISTIVE SENSOR HAVING AN ANISOTROPIC HARD BIAS WITH HIGH COERCIVITY

FIELD OF THE INVENTION

The present invention relates to free layer biasing in a magnetoresistive sensor, and more particularly to a magnetically anisotropic hard bias layer formed over a treated seed layer or under-layer.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider toward the surface of the disk and when the disk rotates, air adjacent to the surface of the disk moves along with the disk. The slider flies on this moving air at a very low elevation (fly height) over the surface of the disk. This fly height is on the order of Angstroms. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. This sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is biased parallel to the ABS, but is free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers, when the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \theta$, where $\theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

A parameter that is critical to proper sensor performance is the stability of the free layer biasing. In prior art spin valve sensors, free layers have had their magnetizations biased by hard magnetic layers (hard bias layers) formed at either side of the sensor. A magnetic bias field from the bias layers, which is magnetostatically coupled with the free layer keeps the magnetization biased in a desired direction parallel with the air bearing surface (ABS). However, as sensors become ever smaller, they become inherently unstable. In current and future spin valve designs, traditional biasing mechanisms are insufficient to ensure reliable, robust biasing. As a result, such sensors suffer from excessive signal noise, to the point where such sensors become impractical.

Therefore, there is a strong felt need for a structure or method that can be employed to ensure or enhance free layer biasing even in very small sensors. Such a structure or method would preferably provide free layer biasing that is robust and well controlled, while still allowing for sufficient free layer sensitivity.

SUMMARY OF THE INVENTION

The present invention provides a magnetoresistive sensor having a magnetically anisotropic hard bias structure for free layer biasing. The bias structure includes a seed layer or under-layer that has been treated with an anisotropic surface texture that induces a desired, aligned grain structure and crystallographic orientation in a hard magnetic layer formed thereover. This grain structure causes the hard magnetic layer to have a magnetic anisotropy oriented in a desired direction to ensure free layer bias stability.

In an embodiment of the invention, the sensor can include a sensor stack having a free layer structure, a pinned layer structure and first and second sides. A bias structure formed adjacent to the side of the sensor stack includes a Cr under-layer with a surface that has an anisotropic roughness. A layer of Cr—Mo alloy can be formed over the surface of the Cr under-layer, and a hard magnetic material such as Co—Pt—Cr alloy can be formed over the Cr—Mo alloy layer. The anisotropic surface texture of the Cr under-layer induces a desired crystalline orientation in the layers deposited thereover, which results in a desired magnetic anisotropy in the hard magnetic material.

In another embodiment of the invention, the hard bias structure can include a layer of Ta that has a surface that has been formed with the anisotropic texture. A layer of Cr—Mo alloy can then be formed over the layer of Ta and the hard magnetic material can be formed over the layer of Cr—Mo alloy. This structure effectively produces a desired crystalline structure in the hard magnetic material, even when the hard bias structure is formed over a crystalline (non-amorphous) substrate, such as in a partial mill sensor design.

In still another embodiment of the invention, the hard bias structure can include a first layer of Ta, with a layer of Si formed over the first layer of Ta. A second layer of Ta is formed over the Si layer and is formed with an anisotropic surface texture. A layer of Cr—Mo alloy is formed over the second Ta layer and a hard magnetic material is formed over the Cr—Mo alloy layer. Again, the surface texture of the second Ta layer induces a desired, aligned crystalline structure that results in a desired magnetic anisotropy in the hard magnetic layer. This structure too, can advantageously be used when forming the hard bias structure on a crystalline substrate such as on an antiferromagnetic (AFM) layer in a partial mill sensor design.

These and other advantages and features of the present invention will be apparent upon reading the following detailed description in conjunction with the Figures.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE INVENTION

The following description is of various embodiments presently contemplated for carrying out this invention. This description is made for the purpose of illustrating the general principles of this invention and is not meant to limit the inventive concepts claimed herein.

Figure 1:
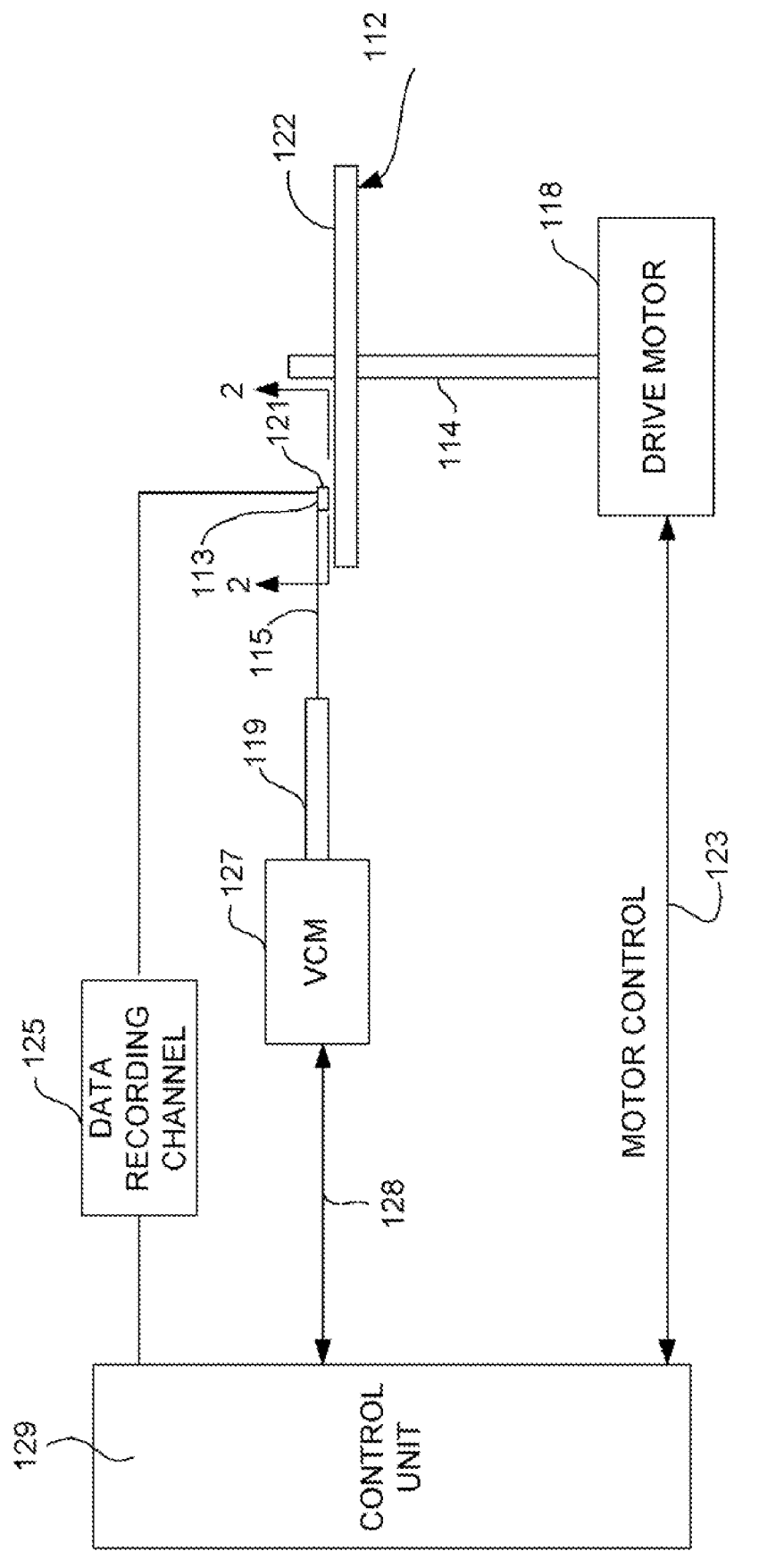
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
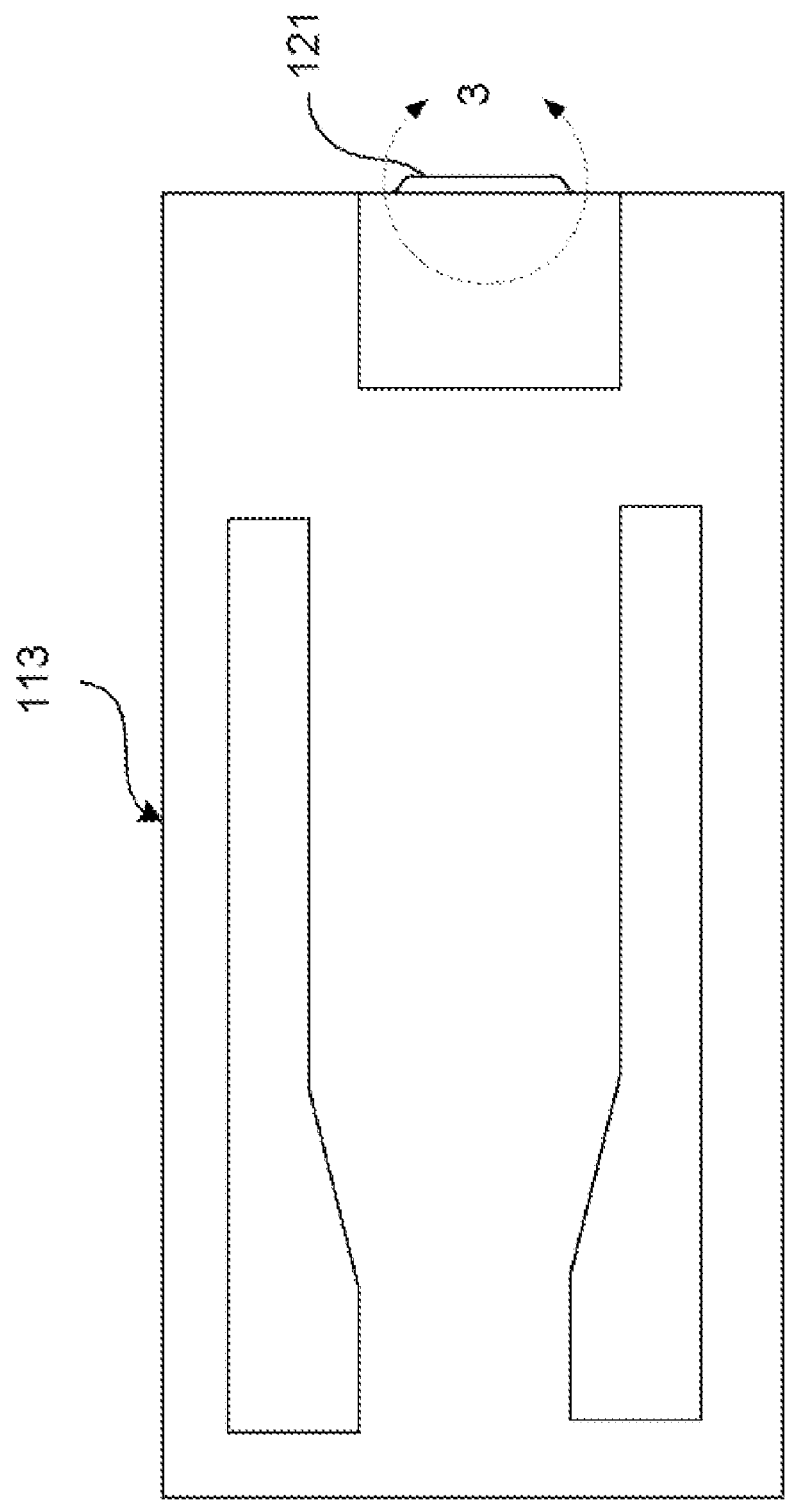
FIG. 2 is an ABS view of a slider, taken from line 3-3 of FIG. 2, illustrating the location of a magnetic head thereon.
Figure 3:
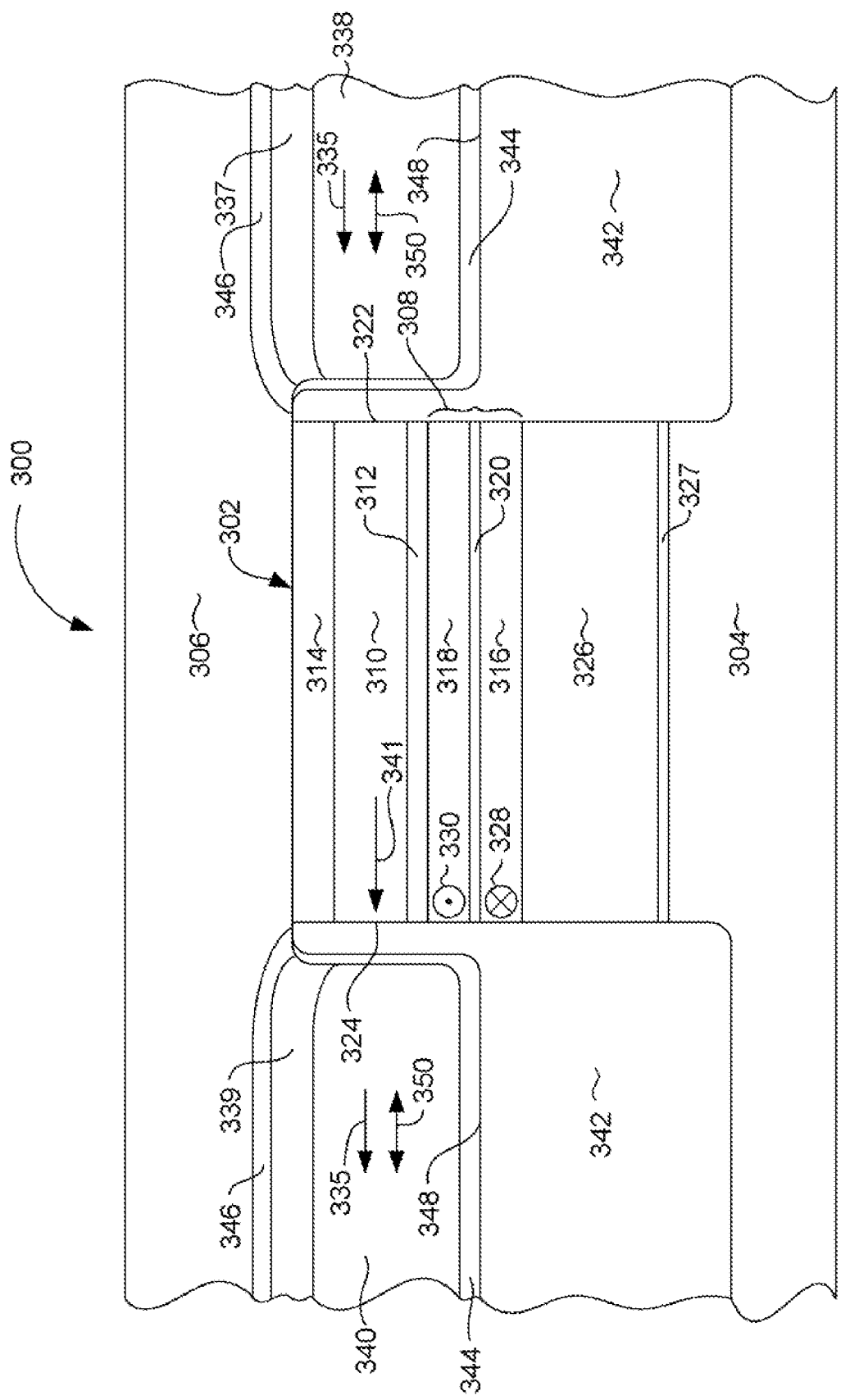
FIG. 3 is an ABS view of a magnetic sensor according to an embodiment of the present invention taken from circle 3 of FIG. 2.

With reference to FIG. 2, the orientation of the magnetic head 121 in a slider 113 can be seen in more detail. FIG. 3 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

With reference now to FIG. 3, a magnetoresistive sensor 300 according to an embodiment of the invention includes sensor stack 302 sandwiched between first and second gap layers 304, 306. The sensor stack 302 includes a magnetic pinned, layer structure 308 and a magnetic free layer 310. A non-magnetic, electrically conductive spacer layer 312, such as Cu, is sandwiched between the free layer 310 and the pinned layer structure 308. A capping layer 314, such as Ta, may be provided at the top of the sensor stack; 302 to protect the sensor from damage during manufacturing, such as from corrosion during subsequent annealing processes.

The pinned layer 308 can be a simple pinned structure or an anti parallel (AP) pinned structure and is preferably an AP pinned structure including first and second magnetic layers (AP1) 316, and (AP2) 318 which may be for example Co—Fe alloy anti parallel coupled across a thin AP coupling layer 320 such as Ru. The free layer 310 can be constructed of various magnetic materials such as Ni—Fe alloy or Co—Fe alloy, and may include layers of Co—Fe alloy and Ni—Fe alloy, preferably with a layer of Co—Fe alloy or Co adjacent to the spacer 312 for optimal sensor performance.

As can be seen with reference to FIG. 3, the sensor stack 302 has first and second laterally opposed side walls 322, 324 that define the track-width or active area of the sensor. A layer of antiferromagnetic material (AFM) 326 such as Pt—Mn alloy or Ir—Mn alloy formed at the bottom of the sensor stack 302 is exchange coupled with the AP1 layer 316. The AFM layer when exchange coupled with the AP1 layer 316 strongly pins the magnetic moment of the AP1 layer 316 as indicated by arrowhead 328. This in turn strongly pins the moment 330 of the AP2 layer 318 by anti parallel exchange coupling across the AP coupling layer 320. The AFM layer 326 may be formed on a seed layer 327 constructed of a material that is chosen to initiate a desired crystallographic structure in the AFM layer 326.

With continued reference to FIG. 3, the sensor 300 includes first and second hard magnetic, bias layers (HB layers) 338, 340. In addition, first and second leads 337, 339 are formed over the HB layers 338, 340. The leads 337, 339 may be constructed of, for example, Ta, Au, Rh or some other electrically conducting material. The HB layers 338, 340 can be constructed of various hard magnetic materials and are preferably constructed of Co—Pt alloy or an alloy containing Co, Pt and Cr, more specifically $Co_{80}Pt_{12}Cr_8$. The hard bias layers 338, 340 have a high magnetic coercivity and are magnetized in a desired direction as indicated by arrows 335. The hard bias layers 338, 340 are magnetostatically coupled with the free layer 310 to bias the magnetization of the free layer 310 in a direction parallel with the ABS as indicated by arrow 341.

With reference still to FIG. 3, the sensor can have an ultra contiguous junction design (UCJ), wherein the sides 322, 324 are very well defined and are substantially vertical. The sensor 300 could also be a more common contiguous junction design having more sloping sides, and could be either a full mill design as shown or could be a partial mill design, wherein a portion of the sensor layers such as the AFM 326 or pinned layer 308 extend beyond the active area of the sensor. Such a structure will be described below with reference to alternate embodiments of the invention.

A thick under-layer 342, extends laterally from each side 322, 324 of the sensor stack 302, the under-layers 342 being disposed on top of a substrate such as the layer 304 that extends from the base of the sensor stack 302. The under-layers can be constructed of Cr or an alloy containing Cr, and are preferably deposited to such a thickness to place the hard bias layers 338, 340 at the level of the free layer 310. The under-layers 342 can, for example, each have a thickness of 250-350 Angstroms or about 300 Angstroms.

A seed layer 344, preferably comprising Cr—Mo alloy is deposited over each under-layer 342. These seed layers 344 may each have a thickness of 40-80 Angstroms or about 60 Angstroms. The hard bias layers 338, 340 can be formed over the seed layers 344. As mentioned above, the hard bias layers 338, 340 can be constructed of Co—Pt alloy or Co—Pt—Cr alloy. A protective capping layer 346 may be formed over the leads 337, 339. The capping layers 346 can be constructed of, for example Ta and function to protect the hard bias and lead layers from damage such as from corrosion during manufacture.

With reference still to FIG. 3, each of the under-layers 342 has a surface 348 that is configured with an anisotropic texture. This anisotropic surface texture (which will be described in greater detail herein below) results in a magnetic anisotropy associated with an easy axis of magnetization 350 in the above applied hard bias layers 338, 340. The magnetic easy axis of magnetization 350 in the hard bias layers 338, 340 is oriented in a desired direction parallel with the Air Bearing Surface (ABS) so that it strongly enhances the stability and strength of the bias field produced by the hard bias layers 338, 340, thereby ensuring robust biasing of the free layer 310 and ensuring free layer stability.

Figure 6:
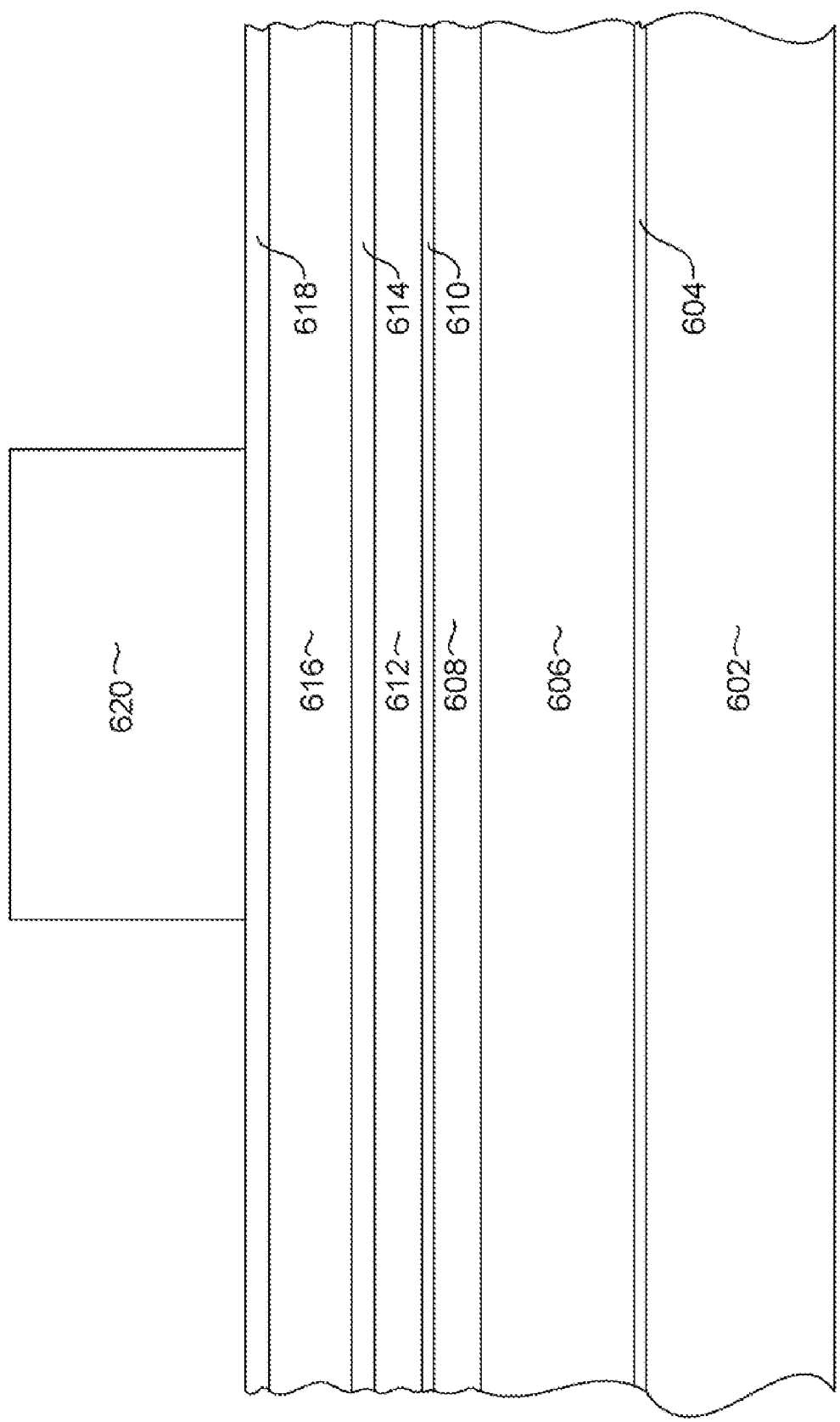
FIGS. 6-10 are ABS cross sectional views of a magnetoresistive sensor shown in various intermediate stages of manufacture illustrating a method of manufacturing a sensor according to the embodiment as illustrated with reference to FIG. 3.

FIGS. 6-10 illustrate a method for constructing a sensor such as that described above with reference to FIG. 3. With particular reference to FIG. 6, a substrate 602 is provided. This substrate may be an alumina gap layer or some other non-magnetic material. A seed layer 604 such as Ta can be deposited over the substrate 602, followed by a layer of antiferromagnetic material such as Pt—Mn alloy or Ir—Mn alloy 606. Then, a first magnetic layer (AP1) 608 is deposited followed by a non-magnetic antiparallel coupling layer such as Ru 610 followed by a second magnetic layer (AP2) 612. Then, a non-magnetic electrically conducive spacer layer such as Cu 614 is deposited over the second magnetic layer 612, followed by a third magnetic layer (free layer) 616 and a capping layer such as Ta 618. A mask structure 620 is then formed over the deposited layers 602-618. The mask structure 620 can include a photoresist or thermal image resist that has been photolithographically patterned and developed to have a width to define a track width of the sensor. The mask can also include one or more hard mask layers such as alumina ($Al_2O_3$) or silicon dioxide as well as image transfer layer such as a soluble polyimide such as DURIMIDE®.

Figure 7:
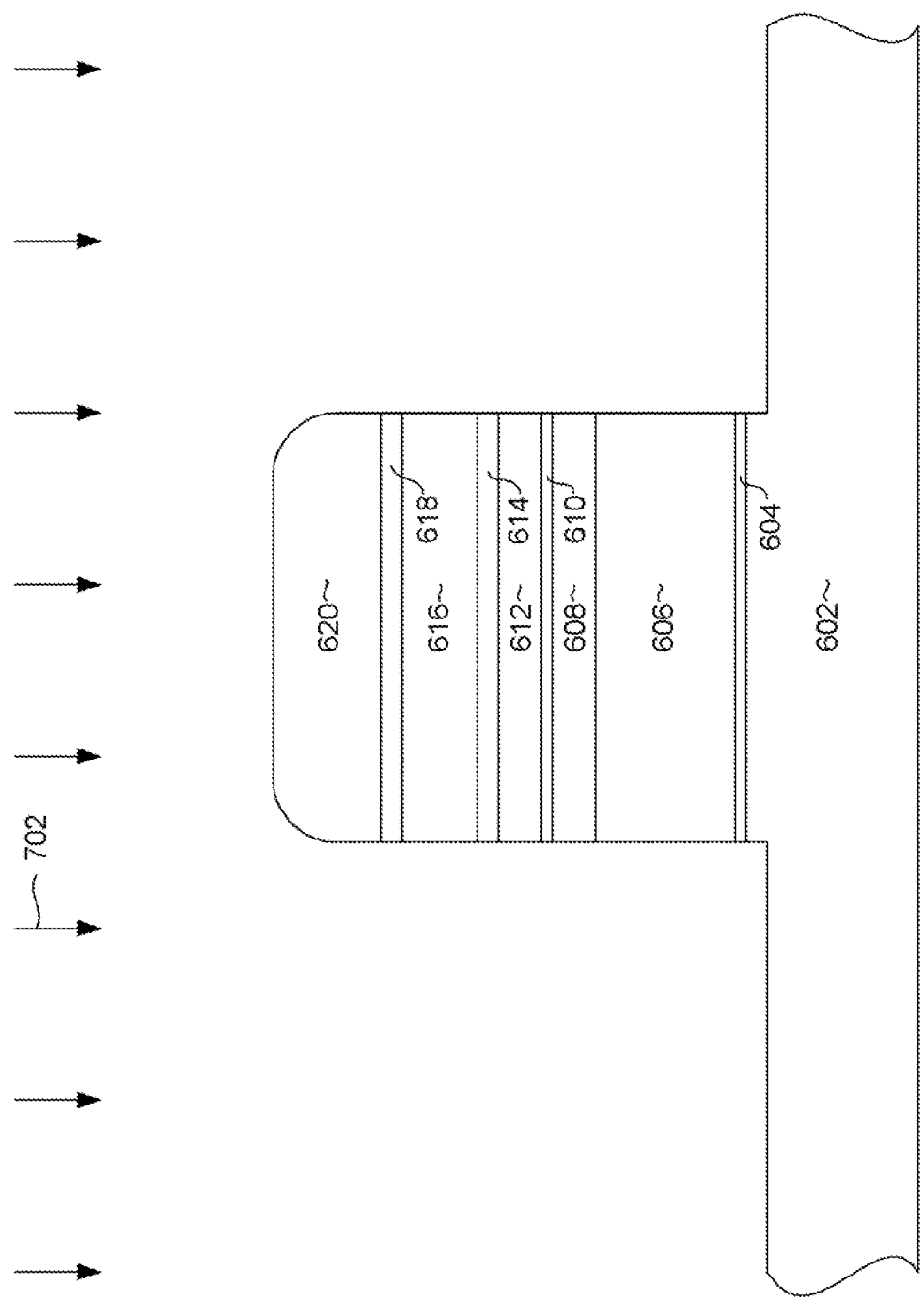
Figure 8:
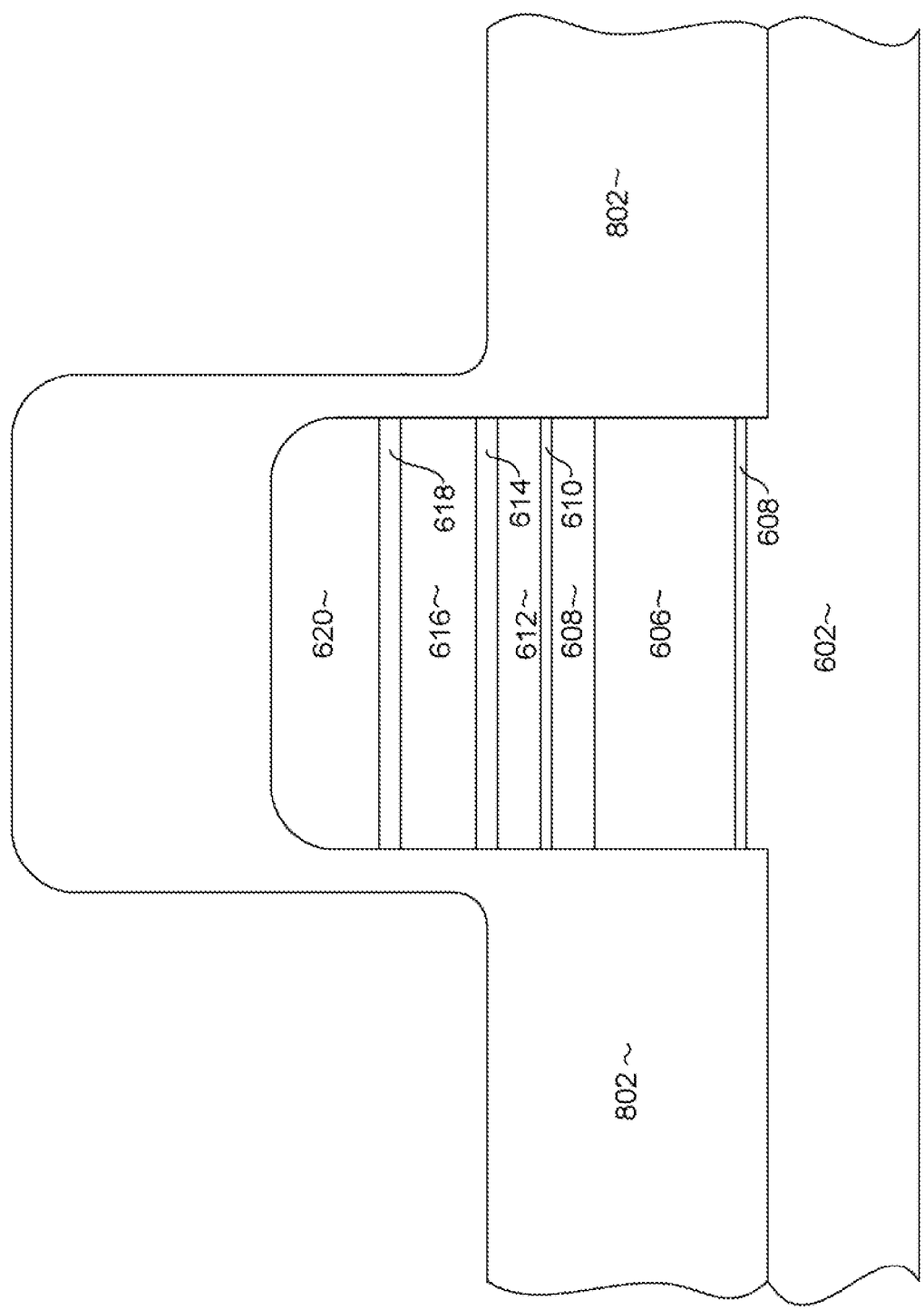
Figure 9:
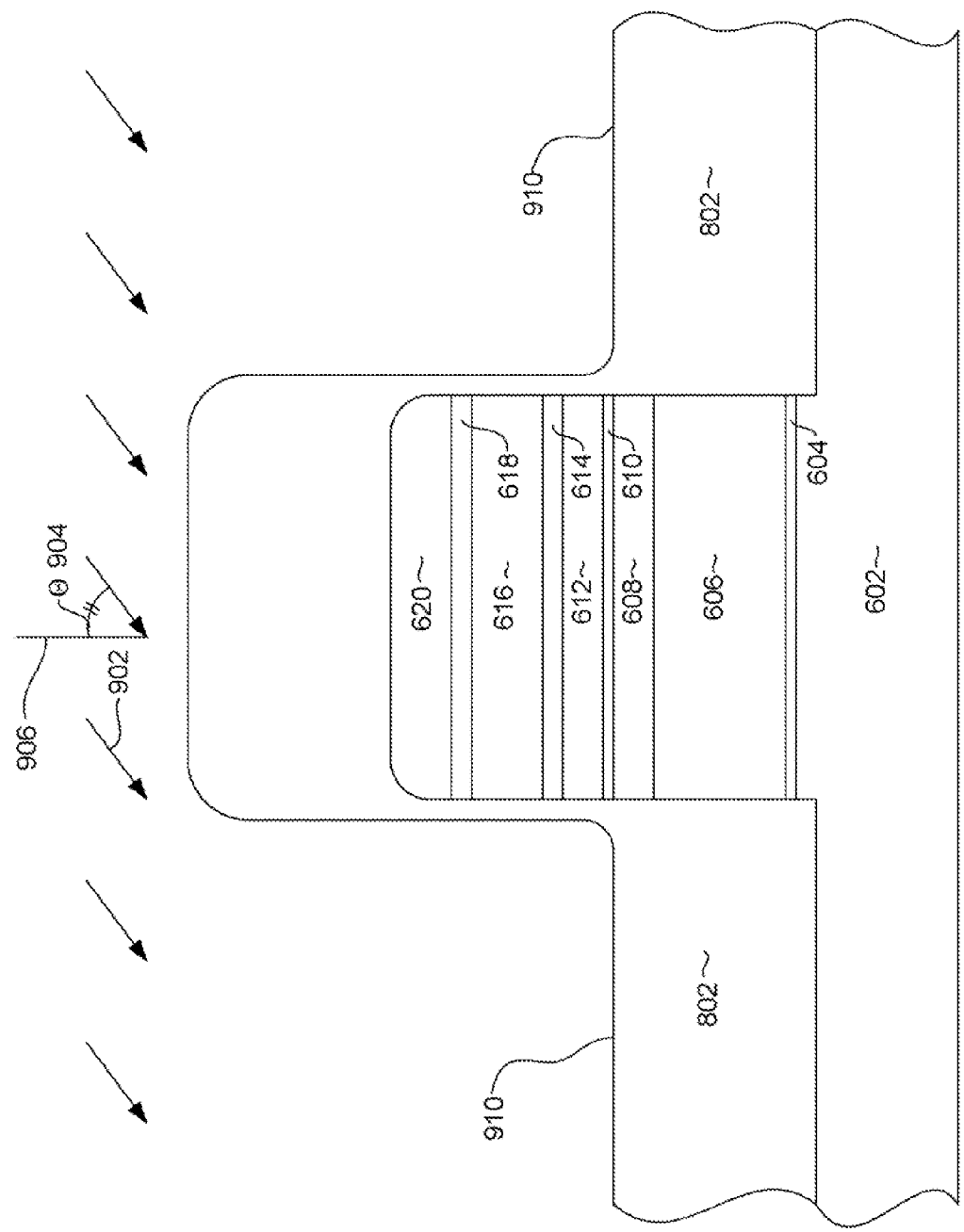

Then, with reference to FIG. 7, a material removal process such as ion milling is performed, using an ion beam 702 to remove portions of the sensor layers 604-618 that are not covered by the mask 620. Then, with reference to FIG. 8 an under-layer material 802, preferably Cr, is deposited. With reference to FIG. 9, a surface treatment is performed by directing an angled ion beam 902 at the deposited under-layer 802 to create an anisotropic texture on the surface of the under-layer. The angled ion milling can be performed by directing the ion beam 902 at an angle, Θ 904, of about 60 degrees (50-70 degrees) relative to normal 906. This angled ion milling will be described in greater detail below with reference to FIGS. 15-17. The under-layer is preferably initially deposited to such a thickness that, after the angled ion milling has been performed on the surface 910 of the under-layer 802 will be just at or just beneath the bottom of the free layer 616. For example, the under-layer 802 could be initially deposited to a thickness of 250-350 Angstroms or about 300 Angstroms. The angled ion milling can remove about 30-50 Angstroms or about 40 Angstroms of the under-layer.

Figure 10:
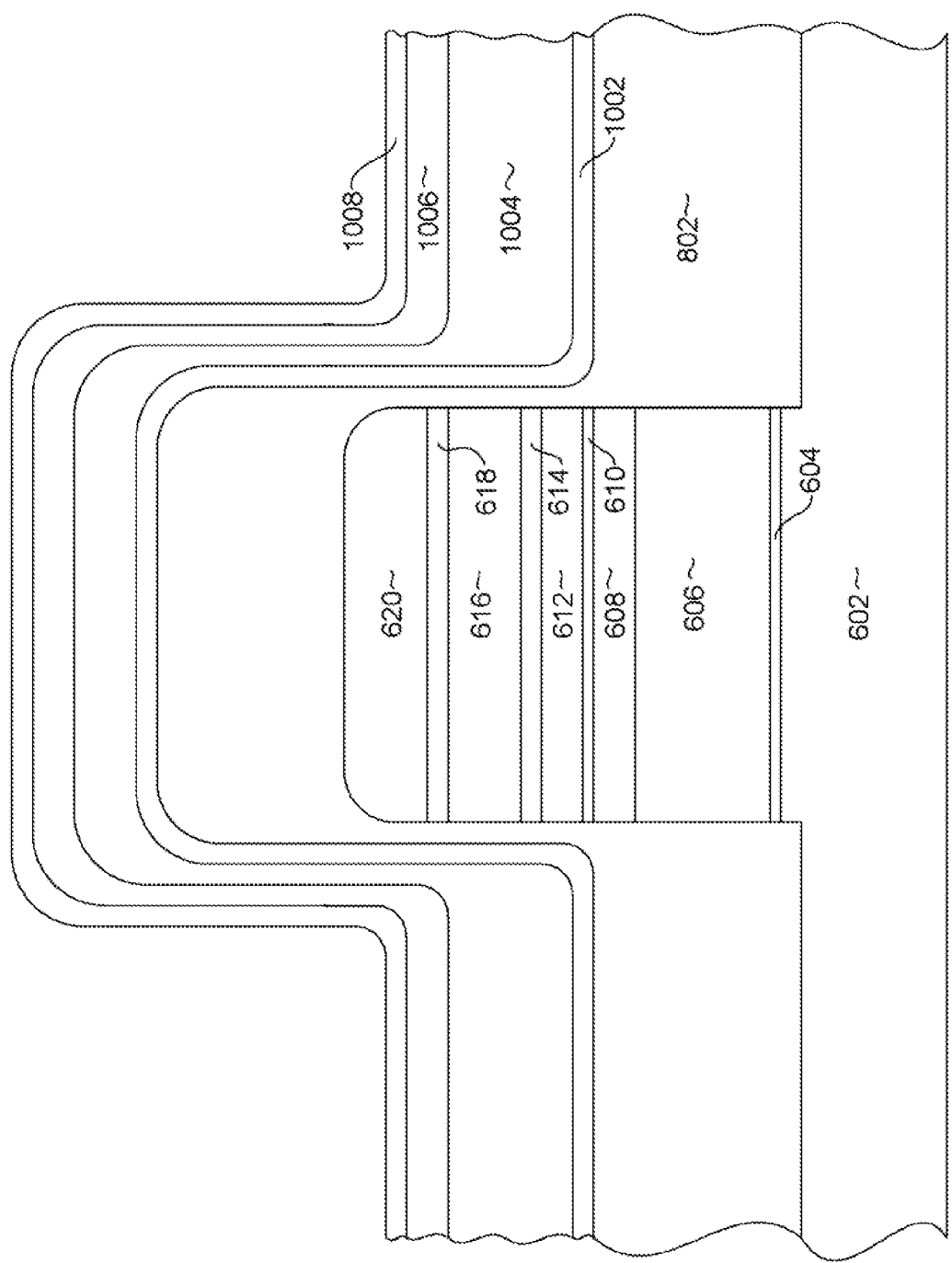

With reference now to FIG. 10 a thin Cr—Mo alloy seed layer 1002 is deposited over the under-layer 802. The seed layer 1002 can be various thicknesses but is preferably deposited to a thickness of 50-70 Angstroms or about 60 Angstroms. Then, a layer of hard magnetic material (high magnetic coercivity) 1004 is deposited over the seed layer 1002. The hard magnetic material 1004 can be Co—Pt alloy or Co—Pt—Cr alloy. An electrically conductive lead material 1006 such as Au, Rh or Cu can then be deposited over the hard magnetic material 1004. Then, a capping layer 1008 such as Ta can be deposited over the lead 1006. After the various layers have been deposited, a chemical mechanical polishing process (CMP) or other similar process can be performed to remove the mask 620 from over the sensor area and to remove the layers 802, and 1002-1008 protruding upward over the mask 620. Then, a non-magnetic gap material such as alumina (not shown) can be deposited to form the structure described with reference to FIG. 3.

Figure 4:
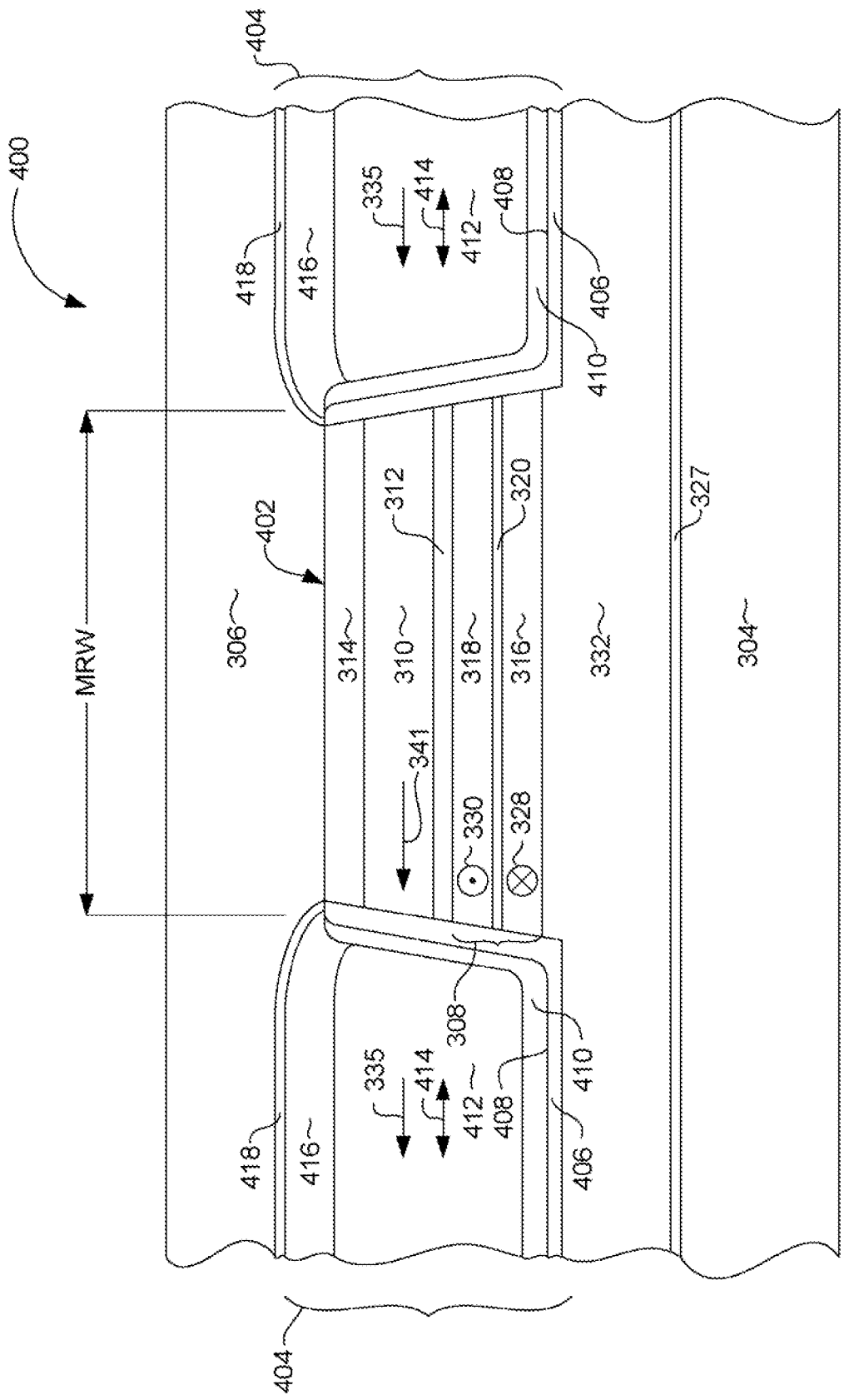
FIG. 4 is an ABS view of a magnetoresistive sensor according to an alternate embodiment of the invention.

With reference now to FIG. 4, a structure according to an alternate embodiment of the invention includes a sensor stack 402 similar to that described with reference to FIG. 3, having a pinned layer structure 308 a free layer 310 and a spacer or barrier layer 312 sandwiched between the pinned and free layers 308, 310. An AFM layer 332 can be contacting and exchange coupled with the AP1 layer 316 of the pinned layer structure 308. The sensor 400 can be a contiguous junction design having sloping side walls or could be an ultra-contiguous junction design having vertical side walls as described with reference to FIG. 3. In addition, the presently described embodiment can be constructed using a partial mill design in which a portion of AFM layer 332 and possibly the pinned layer structure 308 is not removed during milling, but extends beyond the sides or the sensor stack 402.

With, continued reference to FIG. 4, a the sensor 400 can be a partial mill design having a sensor stack 402 that has an active area with a magnetic read width MRW, which may be defined by the width of the free layer 310 and is approximately the same as the track width, TW, on the recorded disk. In a partial mill design, a portion of the sensor stack 402 such as the AFM layer 332 (as shown in FIG. 4) and possibly all or a portion of the pinned layer structure 308 extends significantly beyond the active area of the sensor. Although, the presently described embodiment can be used in a partial mill design as described, it can also be used in a more conventional full mill design. The sensor 400 can also be constructed with as a contiguous junction design wherein the sensor stack 402 has sloping sides as shown in FIG. 4, or could be an ultra-contiguous design having substantially vertical sides as shown earlier in FIG. 3.

The presently described embodiment has a bias structure 404 extending laterally outward from the sides of the active portion of the sensor stack 402. The bias structure 404 includes a Ta seed layer 406 having a surface 408 with an anisotropic texture. A Cr—Mo alloy seed layer 410 is formed over the Ta seed layer 406. A hard magnetic material (hard bias layer) 412 covers the Cr—Mo alloy seed layer 410. The hard bias layer 412 can be constructed of Co—Pt alloy or Co—Pt—Cr alloy and has a magnetic anisotropy associated with an easy axis of magnetization 414 that results from the anisotropic texture of the surface 408 of the Ta seed layer 406. The magnetic anisotropy of the hard bias layers 412 greatly improves the stability of the biasing of the free layer resulting in decreased signal noise and producing a more reliable sensor 400.

The Ta seed layer can have a thickness of 10-30 Angstroms or about 20 Angstroms as processed, and the Cr—Mo alloy seed layer can have a thickness of 40-60 Angstroms or about 50 Angstroms. The hard bias layer 412 can have a thickness of 100-200 Angstroms or about 130 Angstroms. A lead layer 416 can be formed over the hard bias layer 412, and can be constructed of Rh or of Au, Cu or some other electrically conductive material. A capping layer 418 such as Ta can be formed over the lead 416. The lead 416 can have a thickness of 300-400 Angstroms or about 350 Angstroms. The capping layer 418 can have a thickness of 10-30 Angstroms or about 20 Angstroms.

Figure 11:
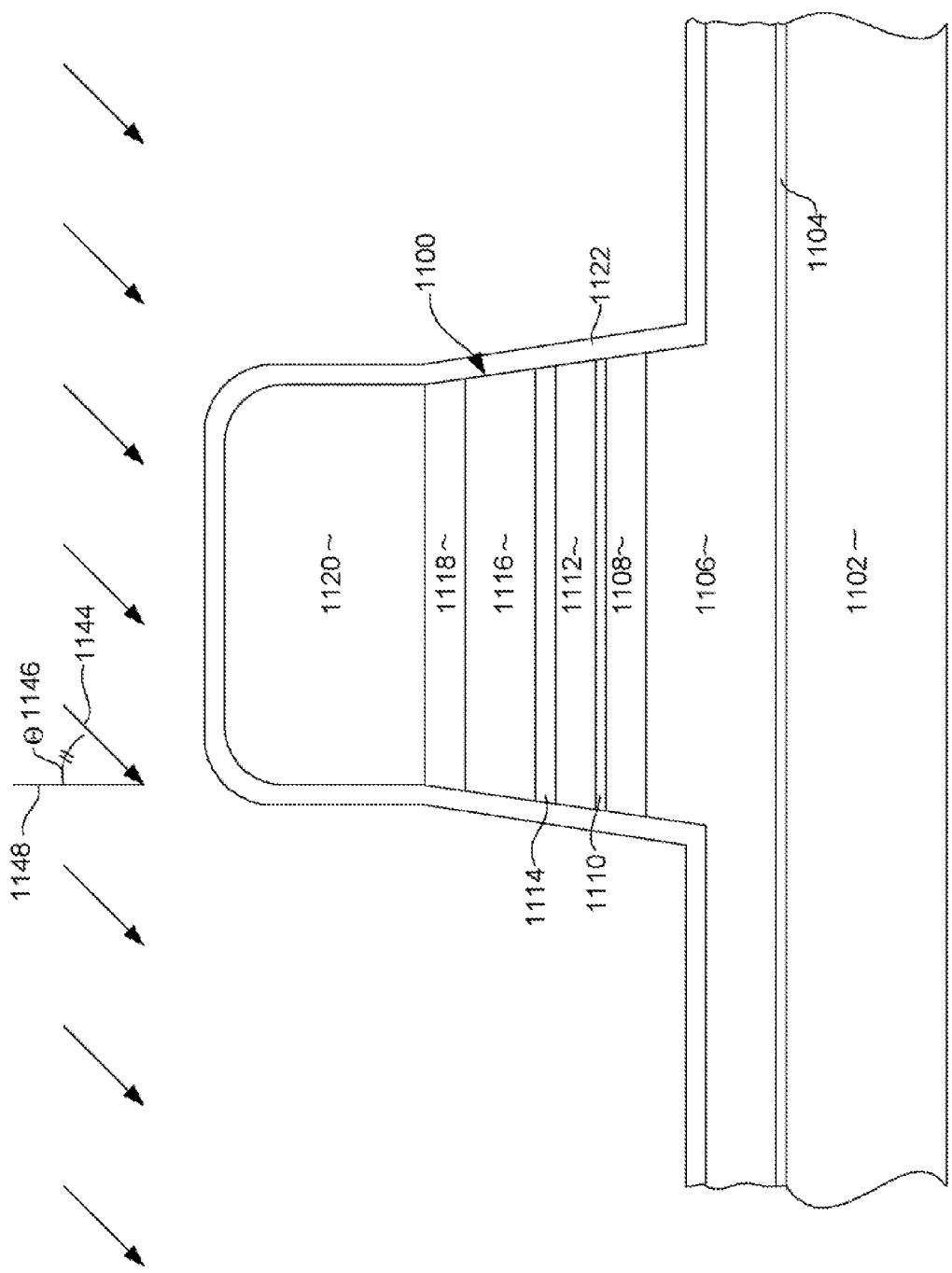
FIGS. 11-12 are ABS cross sectional views of a magnetoresistive sensor shown in various intermediate stages of manufacture illustrating a method of manufacturing a sensor according to the embodiment as illustrated with reference to FIG. 4.
Figure 12:
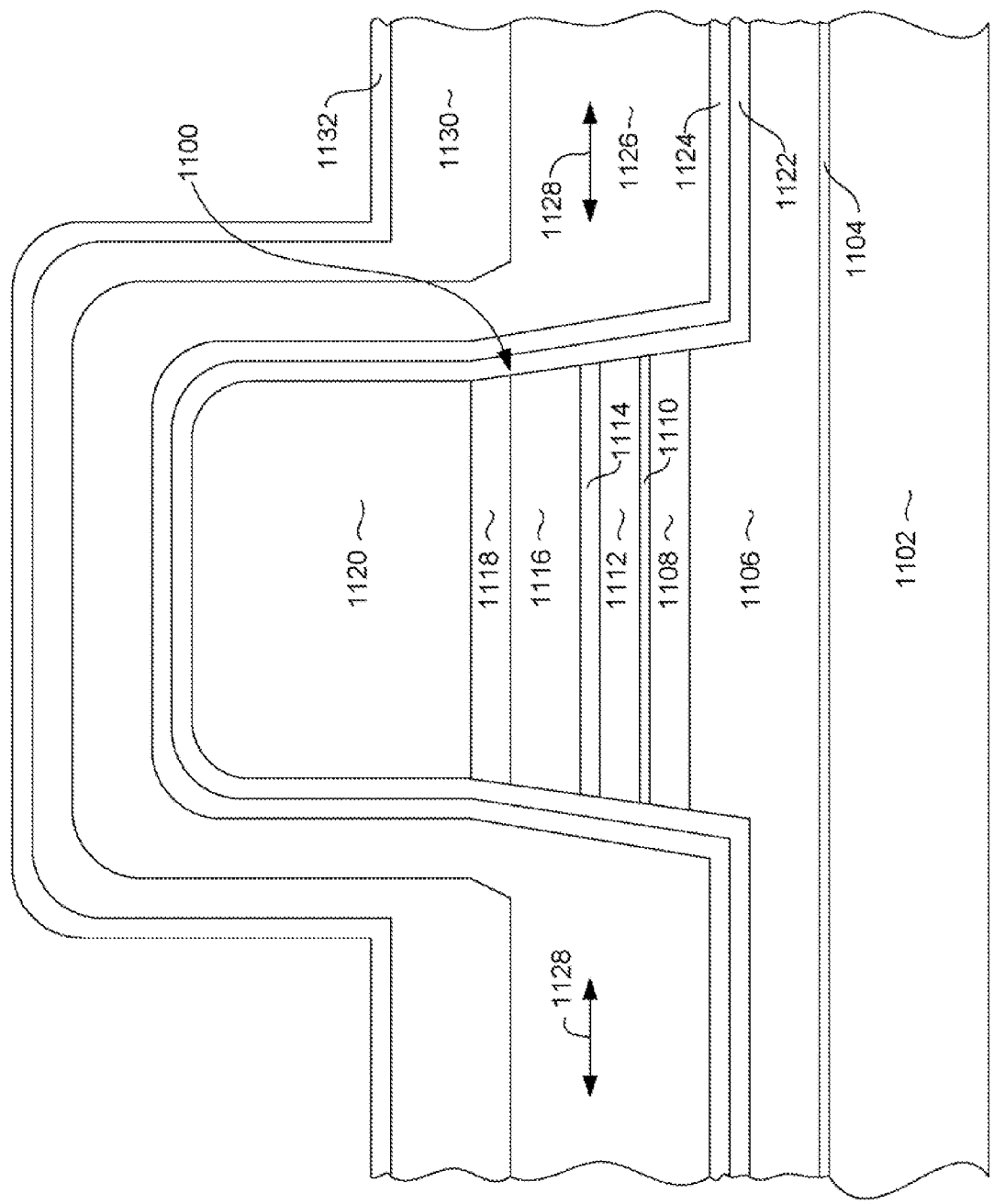

With reference to FIGS. 11-12, a method for manufacturing a magnetic head 400 as described in FIG. 4 is illustrated. With particular reference to FIG. 11, sensor stack 1100 is formed that includes a series of sensor layers deposited over a substrate 1102. The sensor layers can include a seed layer 1104; a layer of antiferromagnetic material AFM layer 1106; AP1 magnetic layer 1108, antiparallel coupling layer 1110; AP2 layer 1112; spacer layer 1114; free layer 1116; and capping layer 1118. A mask structure 1120 is formed over the deposited sensor layer 1104-1118. Then, a material removal process such as ion milling is performed to remove portions of the sensor layers that are not protected by the mask structure 1120. These deposition and ion milling processes can be similar to those described with reference to FIGS. 6 and 7, except that the ion milling can be terminated within a portion of the remaining sensor layers before milling has reached the substrate 1102. For example, the ion milling can be stopped when the AFM layer 1106 has been reached, allowing a portion of the AFM layer 1106 to extend beyond the sides of the active area of the sensor. Such a process can be called a partial mill process.

With continued reference to FIG. 11, a layer of Ta 1122 is deposited. The Ta layer can be deposited to a thickness of 30-50 Angstroms or about 40 Angstroms. Then, a direct, angled ion milling is performed by directing an ion beam 1124 at an angle relative to normal, while the substrate and sensor layers 1102-1120 (deposited on a wafer, not shown) are held on a stationary chuck (not-shown). The angled ion milling can be performed with the ion beam 1144 being directed at an angle, Θ 1146, of 50-70 degrees or about 60 degrees relative to normal 1148.

The angled ion milling results in an anisotropic surface texture that produces a magnetic anisotropy in a later applied hard magnetic layer (not yet shown), and in the case of the presently described embodiment using a Ta seed layer 1122, the direction of magnetic anisotropy is along the direction of the incident ion beam 1124. Because of shadowing from the sensor layers and mask 1106-1120, the ion beam 1124 will only be able to effectively etch one side of the sensor at a time. Therefore, after the angled ion milling has been performed for a first time, the sensor stack 1100 is rotated 180 degrees (ie. by rotating the chuck, not shown) so that the Ta seed 1122 at the other side of the sensor stack 1100 can be etched. Bach etch can be performed sufficiently to remove about 10 Angstroms of the Ta layer so that a total of about 20 Angstroms of Ta is removed. The ion milling can be performed for a duration of, for example, 267 seconds for each side. The milling is preferably performed in a merged ion beam deposition, ion beam etching tool, so the deposition and milling can be performed without breaking vacuum. The angled ion milling is described in greater detail in FIGS. 15-17, wherein the layer 1502 in FIGS. 15-17 corresponds to the Ta seed layer 1122 in FIG. 11.

With reference now to FIG. 12, alter the surface of the Ta seed layer 1122 has been treated with an anisotropic surface roughness as described above, a layer of Cr—Mo alloy 1124 is deposited. Then, a layer of hard magnetic material 1126 (hard bias layer) such as Co—Pt—Cr alloy is deposited. The hard bias layer 1126 has a desired magnetic anisotropy associated with an easy axis of magnetization 1128 oriented parallel to a yet to be formed Air Bearing Surface (ABS), the magnetic anisotropy being caused by a desired crystalline orientation in the hard bias layer 1126 induced by the earlier formed anisotropic surface texture of the Ta seed layer 1122. After the hard bias layer 1126 has been deposited, an electrically conductive lead layer 1130 such as Rh is deposited, followed by a capping layer 1132, which can be Ta.

Figure 5:
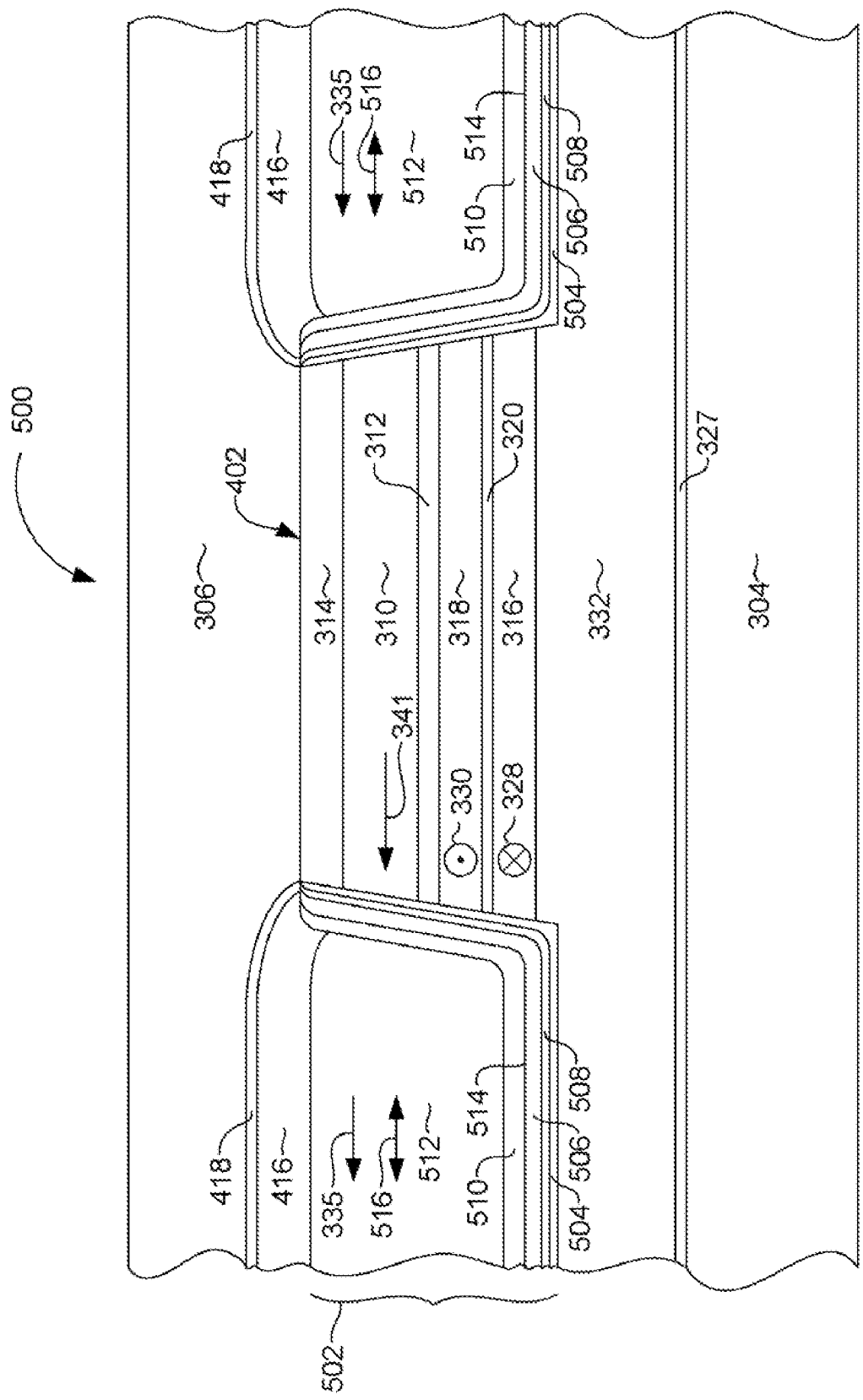
FIG. 5 is a an ABS view of a magnetoresistive sensor according to another embodiment of the invention.

With reference now to FIG. 5, yet another embodiment of the present invention is described. A read head 500 according to this embodiment of the invention includes a sensor stack 402 similar to that described with reference to FIG. 4. As with the sensor 400 described in FIG. 4, the read head 500 may include a sensor 402 having a partial mill design, although a full mill design could be used as well.

The read head 500 includes a bias structure 502 that includes various under-layers or seed layers. The under-layers include first and second Ta layers 504, 506 separated by a thin layer of Si 508. A layer of Cr—Mo alloy 510 is formed over the second Ta layer 506, and a hard magnetic bias layer 512, which may be Co—Pt alloy or Co—Pt—Cr alloy, is provided above the Cr—Mo alloy layer 510. The second Ta under-layer or seed layer 506 has a surface 514 that has been treated with an anisotropic surface texture that induces a magnetic anisotropy associated with an easy axis of magnetization 516 in the above hard bias layer 512.

The first Ta seed layer 504 can have a thickness of 5-15 Angstroms or about 10 Angstroms. The Si seed layer 508 also can have a thickness of 5-15 Angstroms or about 10 Angstroms. The second Ta layer 506 can be thicker, having a thickness of 10-30 Angstroms or about 20 Angstroms (about 40 Angstroms as deposited, as will be seen below). The Cr—Mo alloy seed layer 510 can have a thickness of 40-60 Angstroms or about 50 Angstroms. The hard bias layer 512 can have at thickness 100-200 Angstroms or about 130 Angstroms. As with the previously described embodiment, the read head further includes lead layers 416, which can be Rh, Au, Cu etc., and a Ta capping layer 418.

Figure 13:
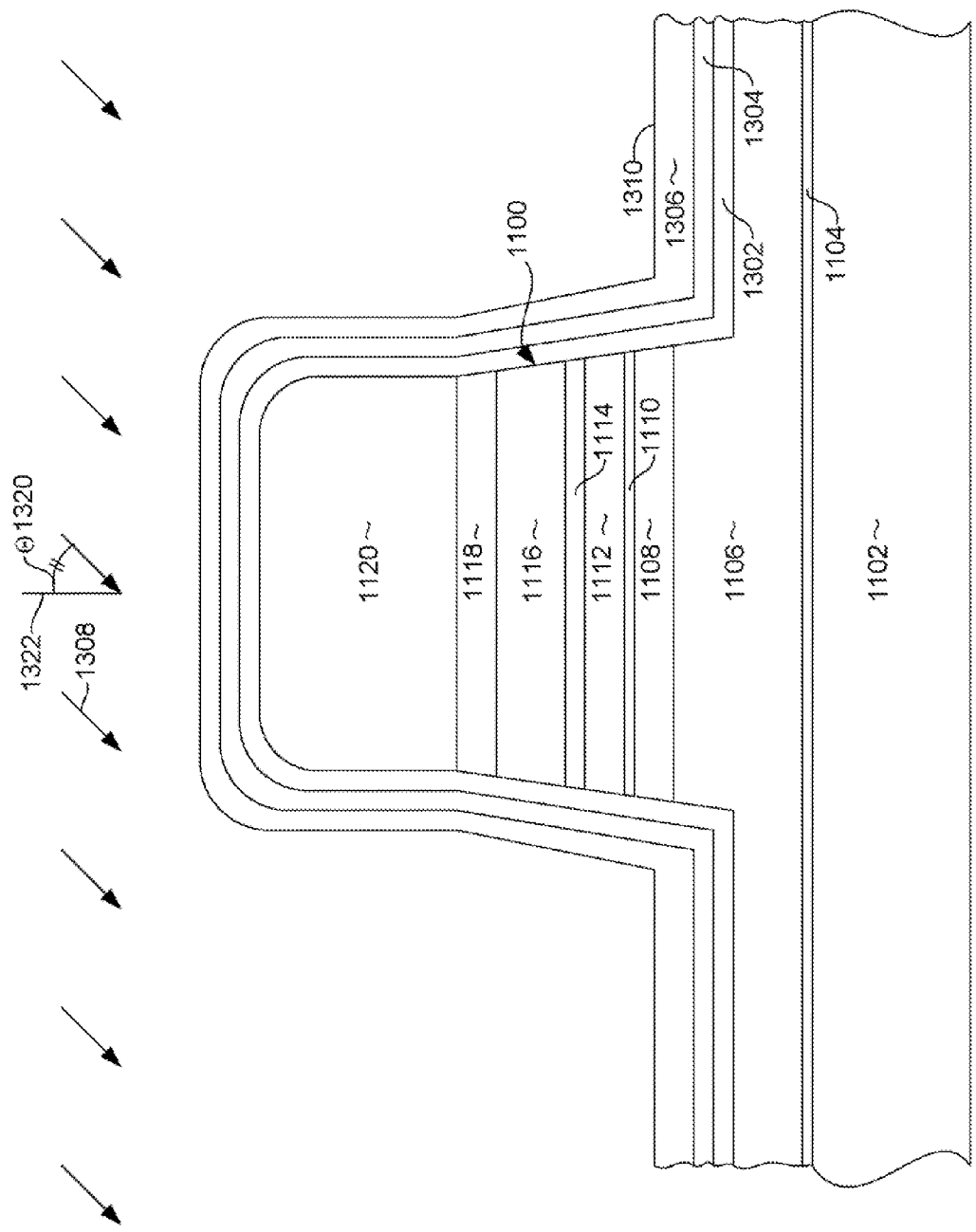
FIGS. 13-14 are ABS cross sectional views of a magnetoresistive sensor shown in various intermediate stages of manufacture illustrating a method of manufacturing a sensor according to the embodiment as illustrated with reference to FIG. 5.
Figure 14:
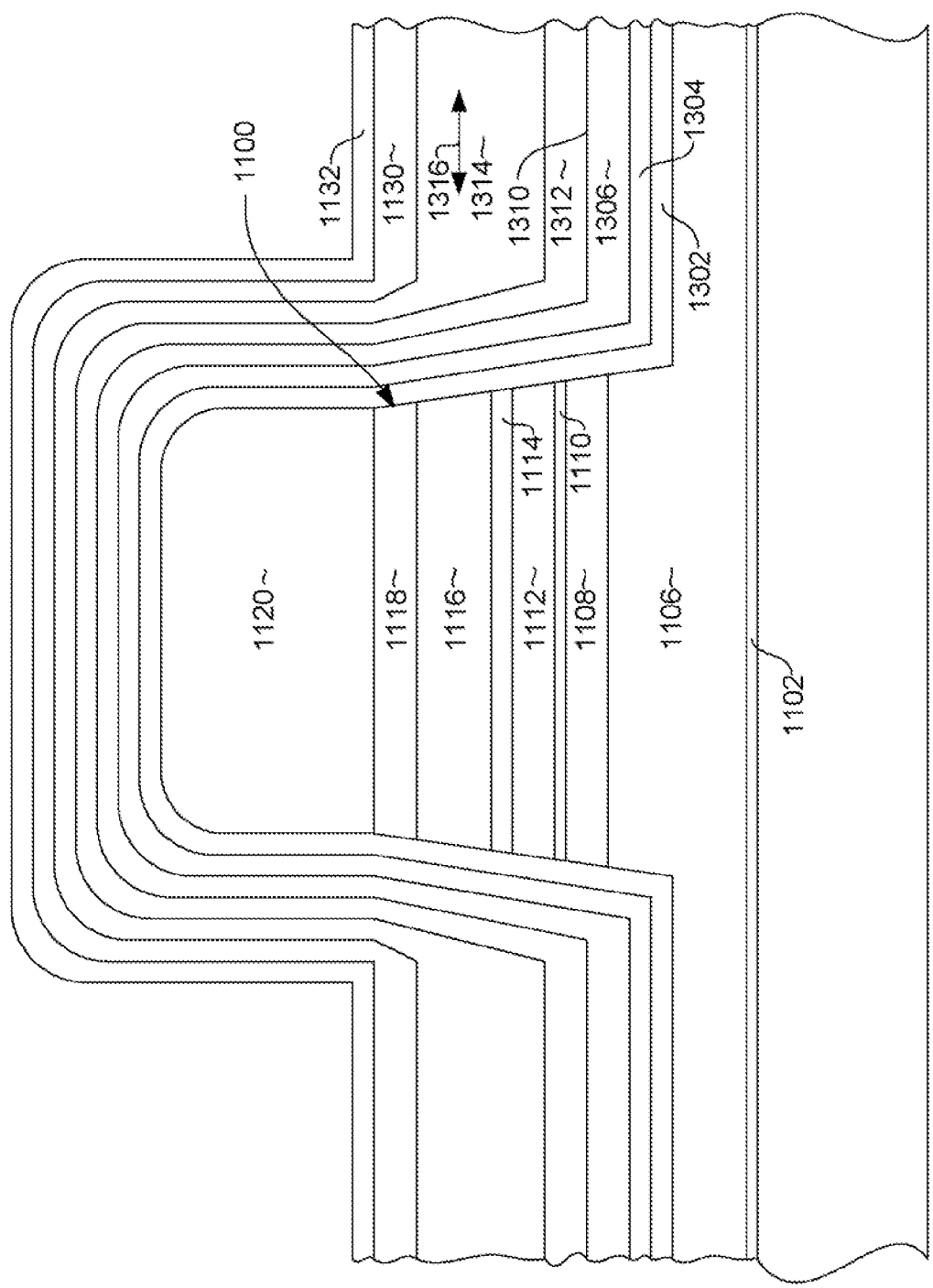

With reference now to FIGS. 13-14, a method is described for manufacturing a read head as described above with reference to FIG. 5. With particular reference to FIG. 13, a sensor stack 1100 is formed. The sensor stack can be formed by the processes described with reference to FIG. 11, and can be formed by a partially milling or fully milling the sensor stack 1100.

After the sensor stack 1100 has been formed, a first layer of Ta 1302 is deposited by a process such as sputter deposition. The first Ta layer can be deposited to a thickness of 5-15 Angstroms or about 10 Angstroms. Then, a layer of Si 1304 is deposited over the first Ta layer 1302. The Si layer can also be deposited to a thickness of 5-15 Angstroms or about 10 Angstroms. Then, a second layer of Ta 1306 is deposited over the Si layer 1304. The second layer of Ta can be deposited to a thickness of 30-50 Angstroms or about 40 Angstroms.

Then, an angled ion milling is performed by directing an ion beam 1308 at an angle, Θ 1320, relative to a normal 1322 of surface 1310 of the second Ta layer 1306. The angled ion milling produces a desired anisotropic texture on the surface 1310 of the second Ta layer 1306. As with the previously described embodiments, the chuck and wafer (not shown) on which the sensor stack 1100 is being formed should be rotated 180 degrees in order to mitigate shadowing effects from the sensor stack 1100. Therefore, the ion milling can be performed in two steps by performing a first angled ion milling for a duration of (for example) 200-300 seconds or about 267 seconds. Then, after rotating the chuck 180 degrees, a second angled ion milling can be performed for 200-300 second or about 267 seconds. The two step ion milling process may remove about 20 Angstroms of the second Ta layer 1306, leaving the second Ta layer with a thickness of 10-30 Angstroms or about 20 Angstroms. The angled ion milling process is described in greater detail in FIGS. 15-17, wherein the layer 1502 in FIGS. 15-17 corresponds to the second Ta layer 1306 in FIGS. 13-14.

Then, with reference to FIG. 14, a layer of Cr—Mo alloy 1312 is deposited onto the textured surface 1310 of the second Ta layer 1306. The Cr—Mo alloy layer 1312 can be deposited to a thickness of 40-60 Angstroms or about 50 Angstroms. A hard bias layer 1314 can then be deposited over the Cr—Mo alloy layer 1312. The anisotropic texture of the surface 1310 of the second Ta layer 1306 induces a desired, aligned crystalline structure in the above applied Cr—Mo alloy layer 1312. This desired, aligned crystalline structure carries through to the hard bias layer 1314 to create a desired magnetic anisotropy associated with an easy axis of magnetization 1316 in the hard bias layer This magnetic anisotropy increases free layer stability by ensuring robust free layer biasing. A lead layer material 1130 such as Rh, Au or Cu can then be deposited followed by a Ta capping layer 1132. A chemical mechanical polishing process (CMP) can then be performed to remove portions of the layers 1302-1314, 1130 and 1132 that protrude up over the sensor stack 1100. The CMP can also remove the mask structure 1120 from over the sensor stack 1100. A non-magnetic gap material 306 can also then be deposited, resulting in the structure described with reference to FIG. 5.

Although, the above embodiments have been described with reference to a current-in-plane (OF) giant magnetoresistive (GMR) sensor, it should be pointed out that this is by way of example only. The enhanced free layer biasing provided by the present invention can be employed in many other types of sensors. For example, the biasing enhancements described above could be employed in a current perpendicular to plane (CPP) GMR sensor or in a tunnel valve.

Figure 15:
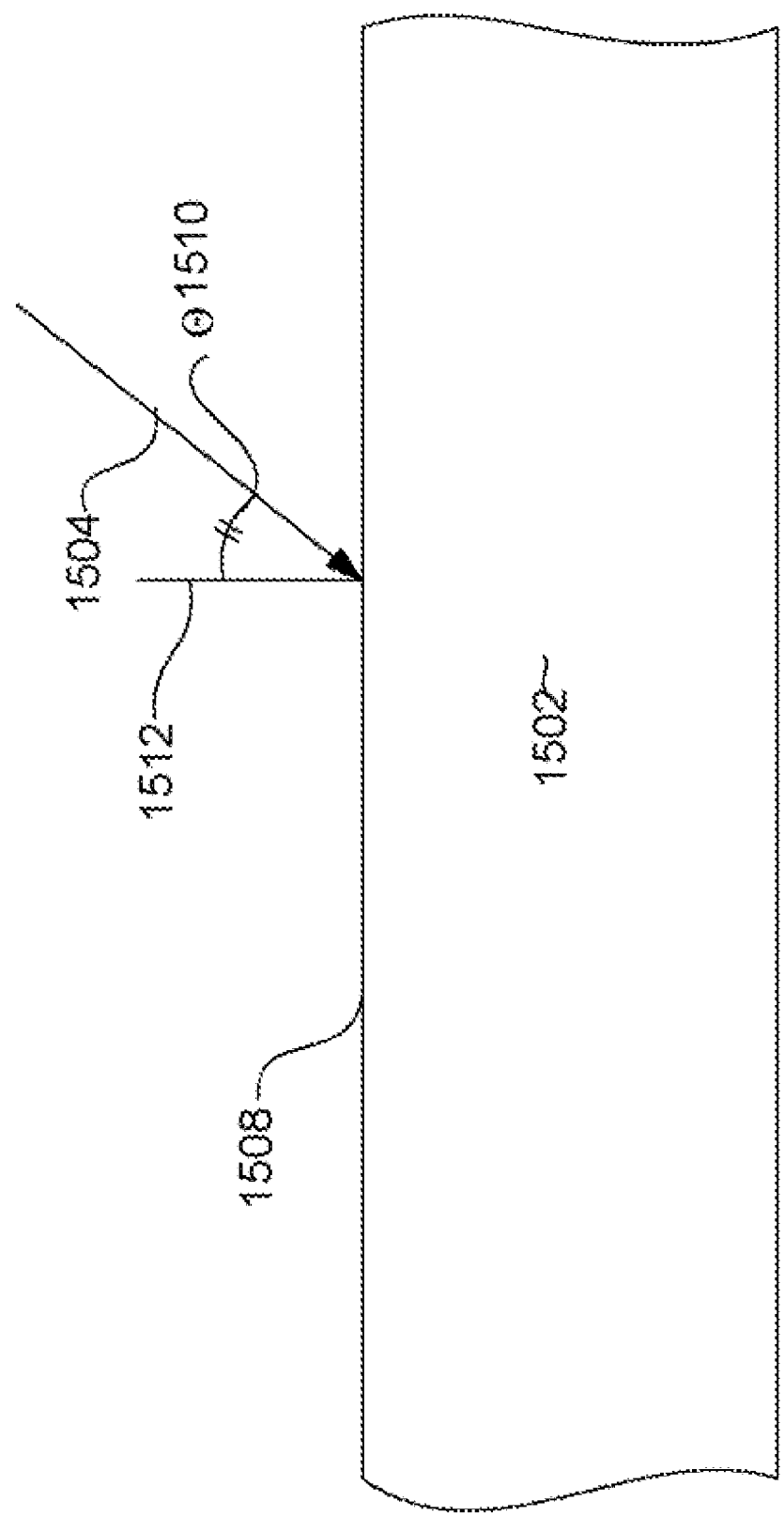
FIG. 15 is a cross sectional view illustrating a method of forming an anisotropic texture on a surface in order to induce a magnetic anisotropy in a material deposited thereon.
Figure 16:
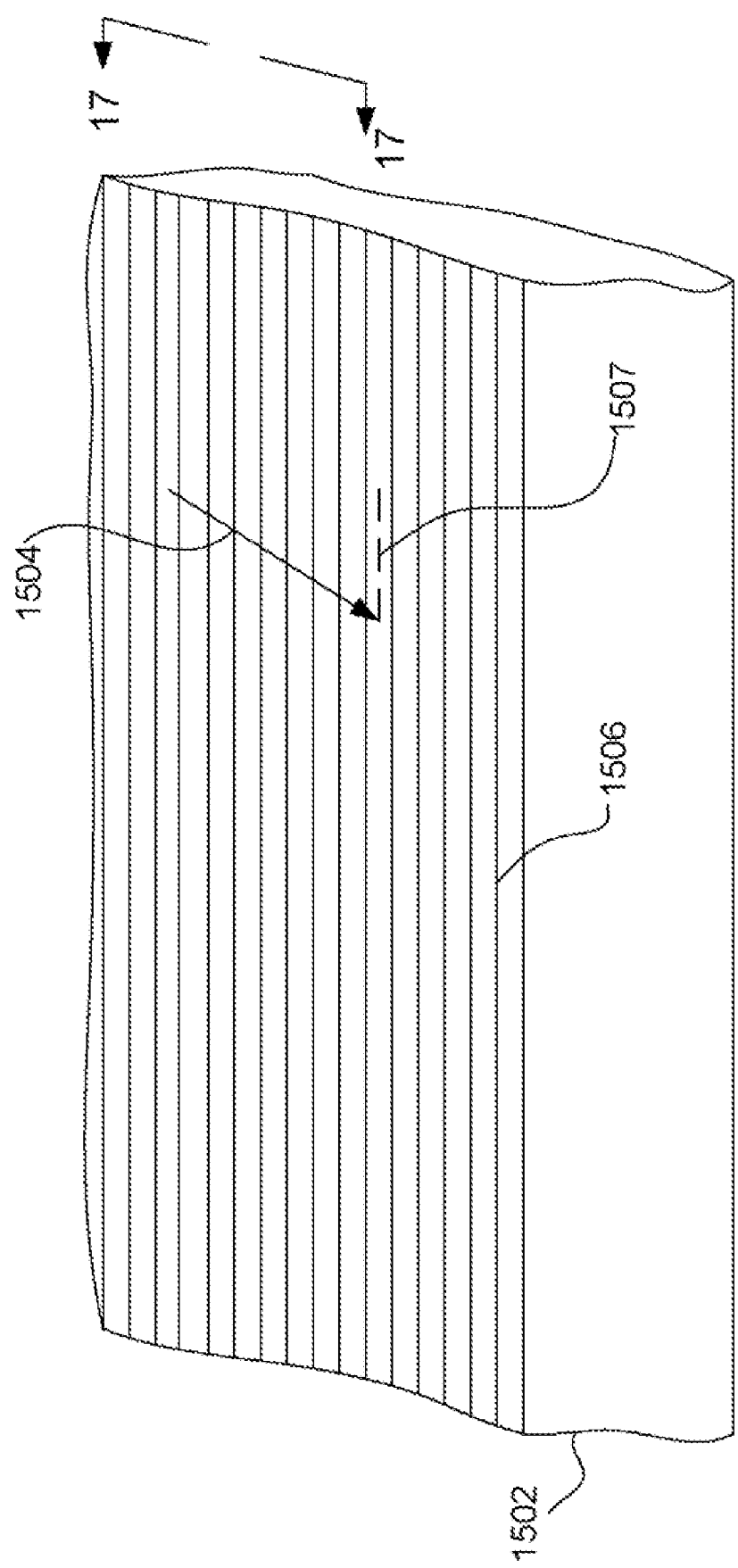
FIG. 16 is a perspective view of the method of forming an anisotropic texture on a surface in order to induce a magnetic anisotropy in a material deposited thereon.
Figure 17:
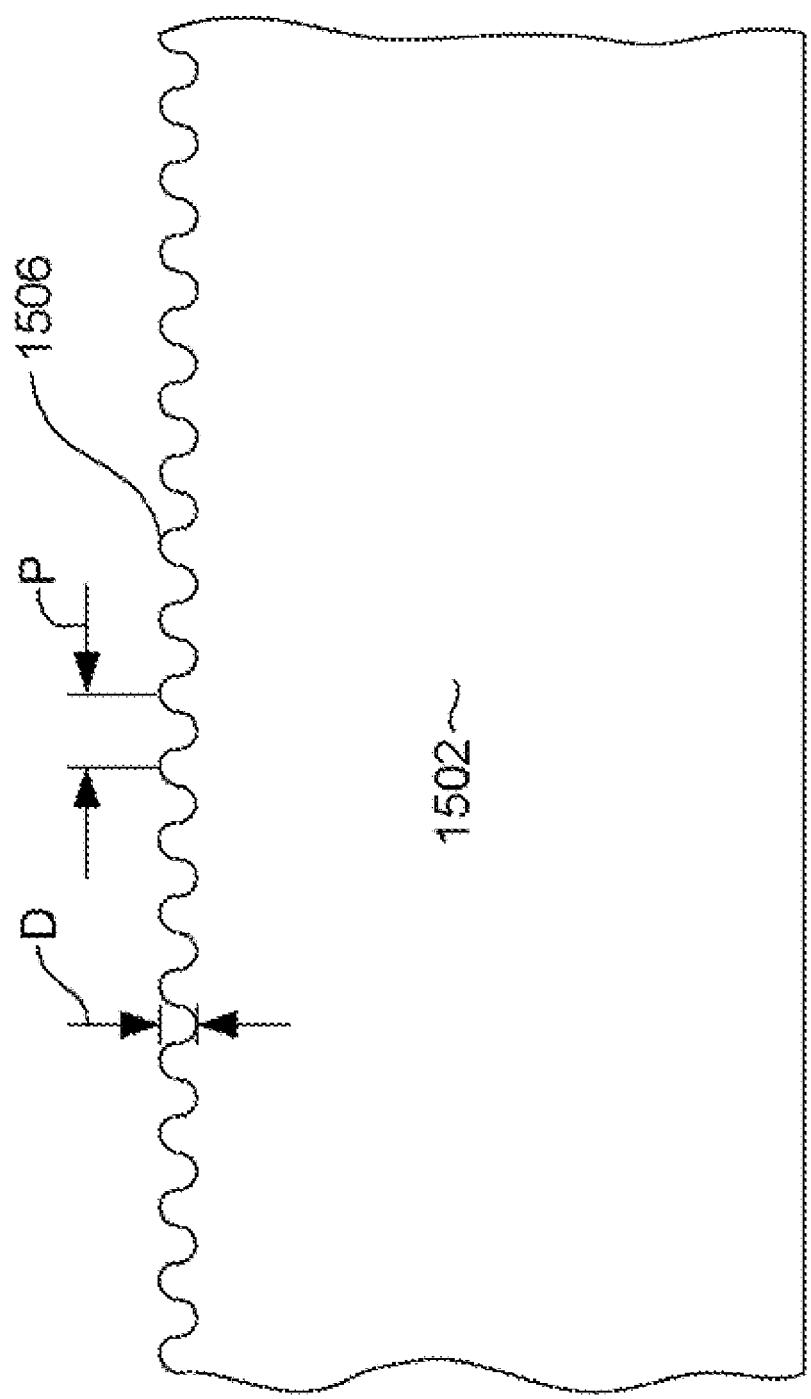
FIG. 17 is a cross sectional view illustrating an anisotropic texture on a surface that might be formed by the method illustrated in FIGS. 15 and 16.

With reference to FIGS. 15-17, a surface treatment used to form an anisotropic roughness on a surface 1508 of a seed layer or under-layer 1502 (or other layer) will be described in greater detail. For purposes of describing a method of producing a texture on the surface 348 of the under-layer 342 described above with reference to FIG. 3, the layer 1502 in FIGS. 15-17 corresponds with the under-layer 342 in FIG. 3. Similarly, the layer 1502 corresponds to the Ta seed layer 406 in FIG. 4 and corresponds to the second Ta layer 506 in FIG. 5.

With particular reference to FIG. 15, a layer of material to be treated 1502 is deposited. For purposes of illustration, the treated layer 1502 will be referred to as a seed layer 1502, although it should be understood that the seed layer 1502 can be layer 342 (FIG. 3), 406 (FIG. 4) or 506, (FIG. 5). A low power ion milling is then performed by directing an ion beam 1504 at an angle, Θ 1510, of less than 90 degrees (preferably 50-70 degrees or about 60 degrees) with respect to a normal 1512 to the surface of the seed layer 1502 (or with respect to the wafer, not shown). The ion milling is preferably performed at a voltage of 20-300 Volts or about 50 Volts.

The angled ion milling induces anisotropic roughness, which may be in the form of, for example, oriented ripples or facets 1506 which can be seen with reference to FIGS. 16 and 17. The typical or average pitch P of the ripples 1506 may be between about 1-200 nm, their average depth D may be between approximately 0.2 to 5 nm or about 0.5 nm. Although shown as uniform ripples in FIGS. 16 and 17, this is for purposes of illustration. The actual surface would more likely be in the form of a more random and irregular surface roughness than what is depicted and shown in FIGS. 16 and 17. After the angled ion milling has been performed sufficiently to form the desired ripples or facets 1506, a Cr—Mo alloy layer 344 (FIG. 3) 410 (FIG. 4) or 510 (FIG. 5) may be deposited. The hard bias layer 338 (FIG. 3), 412 (FIG. 4) or 512 (FIG. 5) can then be formed by depositing high coercivity magnetic material such as for example Co—Pt alloy or Co—Pt—Cr alloy. Depending on the material being treated and the manufacturing conditions, the magnetic easy axis 350 (FIG. 3), 414 (FIG. 4) 516 (FIG. 5) of the applied hard bias layer 338, 412, 512 may be substantially parallel to the in-plane projection 1507 (FIG. 16) of the angled ion beam 1504 onto the surface of the seed layer 1502. Under certain manufacturing conditions and materials being treated, the magnetic easy axis may be either substantially parallel or substantially perpendicular to the in-plane projection 1507 of the angled ion beam 1504. The direction of the ion milling must be chosen such that the resulting magnetic easy axis of the hard magnetic bias layers is substantially parallel to the ABS.

The angled ion etch produced by ion beam 1504 is preferably performed at an angle Θ 1510 of between 30 and 80 degrees and is more preferably performed at an angle of between 35 and 65 degrees with respect to the normal 1512 to the surface of the seed layer 1502. The exact voltage, current, and angle conditions depend on the type and characteristics of the ion source in use.

While various embodiments have been described above, it should be understood that they have been presented by way of example only, and not limitation. Other embodiments failing within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetic read head, comprising:
   a sensor stack including a magnetic free layer structure and a magnetic pinned layer structure, the sensor stack having first and second laterally opposed sides, a portion of the sensor stack extending beyond the first and second sides; and
   first and second bias structures formed adjacent to each of the first and second laterally opposed sides and formed over the portion of the sensor stack that extends beyond the first and second sides, the bias structure comprising:
   an under-layer consisting of Cr, the under-layer having a surface formed with an anisotropic texture wherein the under-layer has a thickness of 250-350 Angstroms and the seed layer has a thickness of 40-80 Angstroms;
   a seed layer formed over the surface of the under-layer; and
   a hard magnetic layer formed over the under-layer, the anisotropic surface texture of the under-layer inducing a magnetic anisotropy in the hard magnetic layer.

2. A read head as in claim 1 wherein the seed layer comprises Cr—Mo alloy and the hard magnetic layer comprises Co—Pt alloy.

3. A read head as in claim 1 wherein the seed layer comprises Cr—Mo alloy and the hard magnetic layer comprises Co—Pt—Cr alloy.

4. A magnetic read head, comprising:
   a sensor stack including a magnetic free layer structure and a magnetic pinned layer structure, the sensor stack having first and second laterally opposed sides, wherein a portion of the sensor stack extends beyond the first and second laterally opposed sides; and
   first and second bias structures formed adjacent each of the first and second laterally opposed sides and formed over the portion of the sensor stack that extends beyond the first and second sides, each bias structure further comprising:
   a first seed layer comprising Ta and having a surface that has an anisotropic surface texture;
   a second seed layer comprising Cr—Mo alloy formed over the surface of the first seed layer; and
   a layer of hard magnetic material formed over the second seed layer, and wherein the anisotropic texture of the surface of the first seed layer induces a magnetic anisotropy in the hard magnetic material.

5. A read head as in claim 4 wherein the first seed layer has a thickness of 10-30 Angstroms and the second seed layer has a thickness of 40-60 Angstroms.

6. A read head as in claim 4 wherein the first seed layer has a thickness of 10-30 Angstroms, the second seed layer has a thickness of 40-60 Angstroms and the layer of hard magnetic material has a thickness of 100-200 Angstroms.

7. A magnetic read head, comprising:
   a sensor stack that includes a magnetic free layer structure and a magnetic pinned layer structure, the sensor stack having first and second laterally opposed sides; and
   a bias structure adjacent to one of the first and second sides of the sensor stack, the bias structure further comprising:
   a first layer comprising Ta;
   a second layer comprising Si formed over the first layer;
   a third layer comprising Ta formed over the second layer the third layer having a surface with an anisotropic texture;
   a fourth layer comprising Cr—Mo alloy formed over the third layer; and
   a hard magnetic layer formed over the fourth layer, and wherein the anisotropic texture of the surface of the third layer induces a magnetic anisotropy in the hard magnetic layer.

8. A read head as in claim 7, wherein the first layer has a thickness of 5-15 Angstroms, the second layer has a thickness of 5-15 Angstroms and the third layer has a thickness of 10-30 Angstroms.

9. A read head as in claim 7, wherein the first layer has a thickness of 5-15 Angstroms, the second layer has a thickness of 5-15 Angstroms, the third layer has a thickness of 10-30 Angstroms and the fourth layer has a thickness of 40-60 Angstroms.

10. A magnetic read head, comprising:
    a sensor stack that includes a magnetic free layer structure and a magnetic pinned layer structure, the sensor stack having first and second laterally opposed sides; and
    first and second bias structures adjacent to each of the first and second sides of the sensor stack, each of the bias structures further comprising:
    a first layer comprising Ta;
    a second layer comprising Si formed over the first layer;
    a third layer comprising Ta formed over the second layer the third layer having a surface with an anisotropic texture;
    a fourth layer comprising Cr—Mo alloy formed over the third layer; and
    a hard magnetic layer formed over the fourth layer, and wherein the anisotropic texture of the surface of the third layer induces a magnetic anisotropy in the hard magnetic layer.

* * * * *